United States Patent [11] 3,603,720

[72] Inventor Lee C. Rable
4602 S.W. Rose St., Seattle, Wash. 98116

[21] Appl. No. 65,994
[22] Filed Aug. 21, 1970
[45] Patented Sept. 7, 1971

[54] HOUSED ELECTRONIC COMPONENT ASSEMBLY
9 Claims, 13 Drawing Figs.

[52] U.S. Cl. 174/52 R, 174/DIG. 8, 264/272
[51] Int. Cl. H05k 5/00
[50] Field of Search 174/52 PE, DIG. 8; 264/272, 230

[56] References Cited
UNITED STATES PATENTS
2,985,874 5/1961 Williams 174/DIG. 8 UX
3,154,631 10/1964 LeMauviel 174/52 PE
3,171,091 2/1965 Goldsmith 174/DIG. 8

*Primary Examiner*—Darrell L. Clay
*Attorney*—Herman L. Gordon

ABSTRACT: A holder consisting of a body of insulating material having a cavity to receive an electronic component. The body has holes in its end wall through which the wire terminals of the component project to act as terminal prongs engageable in a female socket. The body is surrounded by a length of heat shrink tubing to enclose the component. The body has one flat longitudinal wall perpendicular to the plane of the two projecting prongs so as to identify the polarity of the prongs.

PATENTED SEP 7 1971 3,603,720

INVENTOR

LEE C. RABIE

BY Herman L. Gordon

ATTORNEY

HOUSED ELECTRONIC COMPONENT ASSEMBLY

This invention relates to enclosures for electrical components, and more particularly to a holder for electronic components such as resistors, diodes, capacitors, and the like.

A main object of the invention is to provide a novel and improved holder for electronic components wherein a component is safely and conveniently housed and wherein the terminal wires of the component are utilized as connection prongs, so that the component becomes a plug-in unit which can be easily introduced into or removed from an associated circuit without soldering or unsoldering its connection leads.

A further object of the invention is to provide an improved holder for electronic components such as resistors, capacitors, diodes, or the like, which is simple in construction, inexpensive to manufacture, and easy to assemble.

A still further object of the invention is to provide an improved holder for electronic components which is compact in size, rugged in construction and convenient to manipulate and which enables components to be quickly and easily inserted in or removed from an associated circuit without requiring soldering or other complex operations.

A still further object of the invention is to provide an improved holder for electronic components which utilizes the wire leads of the components as connection prongs, whereby the components are converted into plug-in units and which is shaped so that the polarity of the connection prongs can be easily identified.

A still further object of the invention is to provide an improved holder for electronic components utilizing the terminal wires of the components as connection prongs and which includes internal support means to hold components substantially rigidly therein, the parts of the holder being mutually interlocked to hold them together and the holder having a convenient handle element enabling it to be easily and conveniently plugged into a socket or removed therefrom.

A still further object of the invention is to provide an improved holder for electronic components which adapts the components for rapid and easy connection to or disconnection from associated matrix circuits when employed in conjunction with suitable female socket assemblies connected to such matrix circuits, the holder being shaped so that the polarity of a component contained therein is positively identified and so that there is no possibility of installing the component with incorrect polarity.

Further objects and advantages of the invention will become apparent from the following description and claims, and from the accompanying drawings, wherein:

Figure 1:
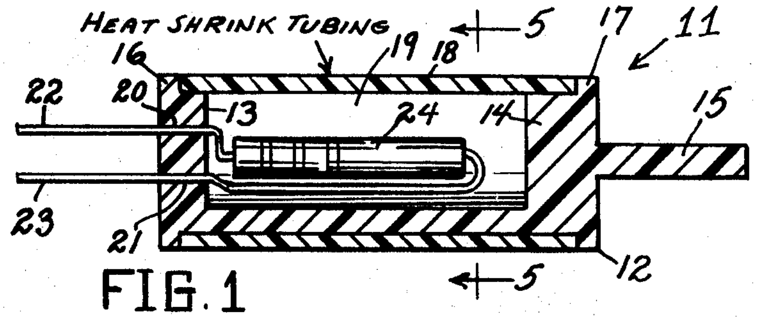
FIG. 1 is a longitudinal cross-sectional view taken through an improved holder according to the present invention, shown with a resistor operatively mounted therein.

Referring to the drawings, and more particularly to FIGS. 1, 2 and 5, 11 generally designates a typical assembly employing a holder according to the present invention. The holder 11 comprises a main body 12 of insulating material, such as molded plastic, having a generally U-shaped cross section and having front and rear end walls 13 and 14. Rear end wall 14 is integrally formed with a longitudinally extending handle rod element 15. End walls 13 and 14 are formed with peripheral flanges 16 and 17 defining therebetween a seat for a length of flexible plastic heat shrink tubing 18 surrounding body 12 and covering its cavity 19.

End wall 13 is formed with parallel longitudinal bores 20 and 21 adapted to snugly receive the terminal wires 22 and 23 of an electronic component, such as a resistor 24, longitudinally disposed in cavity 19, as shown in FIG. 1. The end portions of wires 22 and 23 are frictionally or otherwise rigidly locked in the bores 20, 21, for example, by means of suitable cement, such as epoxy cement. The protruding ends of said wires define a pair of terminal prongs adapted to be received in the correspondingly spaced contact sleeves of a female socket.

Figure 2:
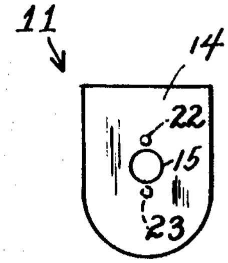
FIG. 2 is an end view of the holder of FIG. 1.

As shown in FIG. 2, the bores 20, 21 and the associated terminal prongs are located in a longitudinal axial plane perpendicular to the flat top wall of the holder, whereby if a component, such as a diode, is housed in the holder, the relative polarity of the terminal prongs may be readily identified.

In assembling the unit 11, the resistor 24, or other component to be housed, is first installed in the cavity 19 with its terminal wires engaged through and secured in the bores 20, 21 and forming prongs, as shown in FIG. 1. The outer cover 18 of flexible heat shrink tubing is then forced over the body 12 and seated thereon between the flanges 16 and 17, the tubing in its final position being substantially flush with the flanges, as shown.

The unit may be easily plugged into or disengaged from its associated socket by employing the rod element 15 as a handle.

Figure 3:
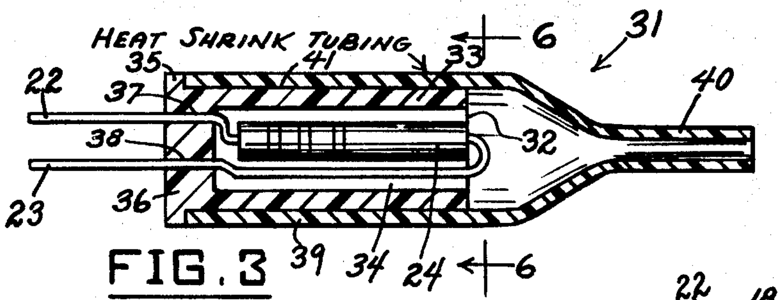
FIG. 3 is a longitudinal cross-sectional view similar to FIG. 1 but showing a modified form of holder according to the present invention.
Figure 4:
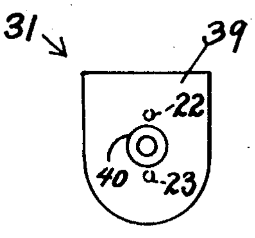
FIG. 4 is an end view of the holder of FIG. 3.
Figures 5, 6, 7, 8, 9, 10, 11:
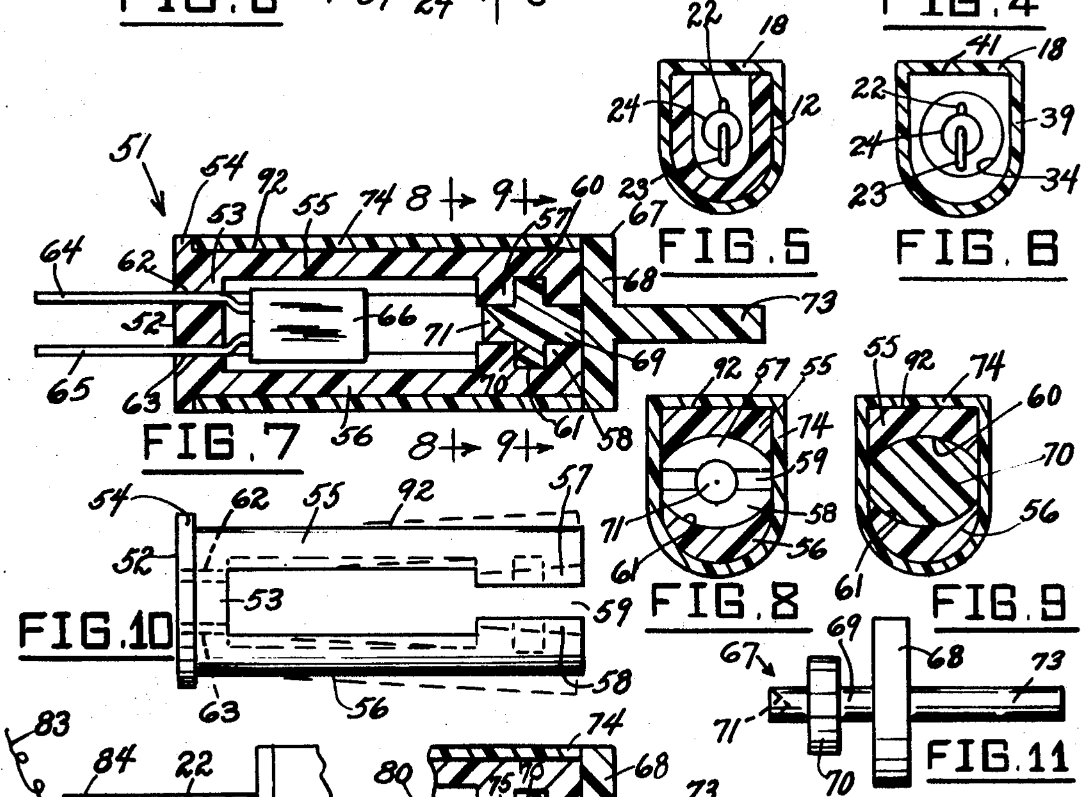
FIG. 5 is a transverse cross-sectional view taken substantially on line 5—5 of FIG. 1.
FIG. 6 is a transverse cross-sectional view taken substantially on line 6—6 of FIG. 3.
FIG. 7 is a longitudinal cross-sectional view taken through a further modified form of holder according to the present invention, shown with a capacitor operatively mounted therein.
FIG. 8 is a transverse cross-sectional view taken substantially on line 8—8 of FIG. 7.
FIG. 9 is a transverse cross-sectional view taken substantially on line 9—9 of FIG. 7.
FIG. 10 is a side elevational view of the main body of the holder of FIG. 7.
FIG. 11 is a side elevational view of the interlocking handle plug element employed with the body of FIG. 10.

Referring to FIGS. 3, 4 and 6, an assembly 31 comprises a main body 32 of molded plastic having a generally U-shaped cross-sectional contour, but having a longitudinal top wall 33 with a flat top surface 41 and having a longitudinal bore or recess 34 opening at the rear end of the body. Said body has a front peripheral flange 35 at its front wall 36. Said front wall is formed with parallel longitudinal bores 37, 38 located in a longitudinal axial plane perpendicular to the flat top surface 41 of wall 33. A component, such as a resistor 24 is disposed longitudinally in the bore 34 with its terminal wires 22, 23 extending through and suitably secured in the bores 37, 38, defining terminal prongs as in the previously described form of the invention. A tubular cover 39 of flexible heat shrink plastic material is forced over the body to be frictionally secured thereon flush against the flange 35, as shown. The cover 39 has a reduced tubular rear end portion 40 serving as a handle.

Referring now to FIGS. 7 to 12, 51 designates an assembly employing a further embodiment of the present invention. The holder of FIGS. 7 to 12 comprises a main body 52 of somewhat flexible molded plastic material having a generally U-shaped cross-sectional outer contour. Body 52 has a front wall portion 53 provided with a peripheral flange 54. Projecting longitudinally from wall portion 53, as viewed in FIGS. 7 and 10, are upper and lower somewhat flexible arms 55 and 56 formed with inwardly thickened opposing end portions 57 and 58 defining a slot 59 therebetween. The opposing end portions 57 and 58 are formed with opposing transverse arcuate recesses 60 and 61.

Arm 55 has a flat longitudinal top surface 92, and front wall portion 53 is formed with a pair of parallel longitudinal bores 62, 63 located in a longitudinal axial plane perpendicular to flat surface 62. The bores 62 and 63 are spaced to receive the terminal wires 64, 65 of an electronic component, such as a capacitor 66 disposed in the space between the arms 55 and 56, as shown in FIG. 7. As in the previously described forms of the invention, the terminal wires 64, 65 are rigidly locked in the bores 62, 63 by friction or by the use of a suitable cement. Thus, the protruding ends of said terminal wires define a pair of connection prongs for the component adapted to be plugged into a suitable female socket.

Designated at 67 is a handle plug member of insulating material, such as molded plastic, comprising a main flange 68 similar in outline shape to flange 54. Integral with flange 68 is an inwardly directed axial stem element 69 formed with an integral generally oval flange portion 70 which generally conforms in shape with the generally oval space defined between the opposing arcuate recesses 60 and 61.

The inner end of the stem element 69 is formed with a generally conical recess 71 for receiving the loop of a terminal wire so as to act as a support for a component housed between arms 55 and 56, as will be presently described.

Plug member 67 is provided with the outer axial rod portion 73 serving as a handle element for the unit.

The assembly 51 is provided with a tubular cover sleeve 74 of flexible insulating material which extends between flanges 54 and 57, as shown in FIG. 7. The sleeve 74 may comprise heat shrink tubing, as in the previously described forms of the invention. Said sleeve may be forced over the body 52 after the component 66 has been installed therein and the handle plug member 67 has been interlocked therewith in the manner illustrated in FIGS. 7, 8 and 9. As shown in FIG. 10, the arms 55 and 56 are sufficiently flexible to allow the top and bottom portions of flange 70 to be respectively engaged in the recesses 60, 61, for example, by manually spreading the arms 55 and 56 apart and slipping stem portion 69 laterally between the thickened portions 57 and 58 thereof. When the arms are released they resume their normally parallel relationship and rigidly interlock with flange 70.

As will be apparent, plug member 67 may also be installed by forcing it in an axial direction inwardly between the manually spread-apart thickened portions 57 and 58 of arms 55, 56. This enables conical recess 71 to be engaged over a terminal wire U-bend of a resistor, diode, or similarly shaped component 80 housed between arms 55 and 56 in the manner illustrated in FIG. 12, so that the recess 71 provides support for the rear end of the component and prevents it from vibrating or shaking in the holder.

Figure 13:
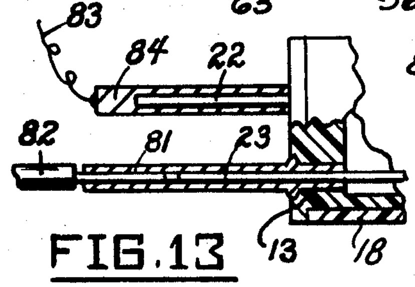
FIG. 13 is a fragmentary cross-sectional view showing how auxiliary connection sleeve elements may be employed with the connection prongs of a component in a holder according to the present invention.
Figure 12:
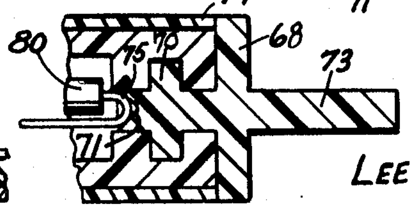
FIG. 12 is a fragmentary longitudinal cross-sectional view showing how the handle plug element interlocks with a component housed in the holder to rigidly support the component.

FIG. 13 illustrated how a tubular metal sleeve 81, of the "enforce male" type, may be provided in a holder assembly according to the present invention to receive a component lead wire 23. The sleeve 81 is pressed or molded into the front end wall 13 of the holder. The lead wire 23 is received in the sleeve and may be force-fitted or soldered therein. The metal sleeve 81 is adapted to receive a male terminal plug 82. Thus, the unit may be readily connected to leads provided with such male terminal plugs.

In a similar manner, a lead 83 provided with a female sleevelike terminal 84 may be connected to a prong 22 by engaging the sleevelike terminal 84 on the prong 22 in the manner illustrated in FIG. 13.

Cover elements other than heat shrinkable tubing may be employed as the holder-enclosing means, within the spirit of the present invention. Thus, the cover element may be formed by dipping the holder in molten insulating material and allowing it to harden, or the cover element may be molded onto the holder.

Other means for establishing the relative polarity of the terminal prongs may be employed instead of the flat top wall described above. Thus, the holder may have any desired cross-sectional shape of a nature to indicate the relative polarity of the prongs. The prongs may, if so desired, be identified either by their location or by their relation to or proximity to any distinctive cross-sectional shape feature of the holder, such as a flat, groove, or the like.

While certain specific embodiments of improved holders for electronic components have been disclosed in the foregoing description, it will be understood that various modifications within the spirit of the invention may occur to those skilled in the art. Therefore it is intended that no limitations be placed on the invention except as defined by the scope of the appended claims.

What is claimed is:

1. A housed electronic component assembly comprising an elongated body of insulating material having a longitudinal cavity and an end wall formed with a pair of longitudinal bores, an electronic component disposed in said cavity, said component having a pair of terminal wires extending through and secured in said bores and defining terminal prongs, and insulating cover means surrounding said body and substantially enclosing said component, said cover means comprising a length of heat shrinkable plastic tubing shrunk in tight engagement with and around said body and component.

2. The assembly of claim 1, and wherein said elongated body has a substantially U-shaped transverse external contour, said plastic tubing presenting one flat longitudinal side surface on the assembly to identify the polarity of the terminal prongs.

3. The assembly of claim 2, and a peripheral flange on said end wall, said tubing being substantially in edge contact with said flange and being substantially flush with said flange, said body having a reduced longitudinally extending handle rod element attached to the body at the end thereof opposite said end wall.

4. The assembly of claim 3, and wherein said flat side surface is substantially perpendicular to the end wall containing said terminal prongs.

5. The assembly of claim 3, and wherein said cavity opens laterally of the body and is covered by said plastic tubing, the portion of the tubing covering the open side of the cavity being substantially flat and defining said flat longitudinal side surface of the assembly.

6. The assembly of claim 3, and wherein said cavity opens at the end of the body opposite said end wall and said handle rod element comprises a reduced tubular extension of said plastic tubing adjacent the open end of the cavity.

7. The assembly of claim 3, and wherein said body includes a pair of relatively flexible longitudinal arms extending from said end wall and defining said cavity therebetween, said arms having opposing recesses at their free end portions, said handle rod element having an inner stem provided with a flange lockingly received in said recesses and having an outer flange engaged against the ends of said arms.

8. The assembly of claim 7, and wherein said arms have inwardly thickened free end portions engaging opposite sides of said stem, said recesses being formed in said inwardly thickened end portions.

9. The assembly of claim 8, and wherein said stem has a recess in its inner end and wherein a portion of the electronic component is supportingly received in said last-named recess.